(12) United States Patent
Baldus

(10) Patent No.: US 9,537,430 B2
(45) Date of Patent: Jan. 3, 2017

(54) CLAMP WITH BURLS-ELECTRODE

(71) Applicant: Berliner Glas KGaA Herbert Kubatz GmbH & Co., Berlin (DE)

(72) Inventor: Oliver Baldus, Berlin (DE)

(73) Assignee: Berliner Glas KGaA Herbert Kubatz GmbH & Co., Berlin (DE)

( * ) Notice: Subject to any disclaimer, the term of this patent is extended or adjusted under 35 U.S.C. 154(b) by 92 days.

(21) Appl. No.: 14/723,635

(22) Filed: May 28, 2015

(65) Prior Publication Data
US 2015/0349670 A1 Dec. 3, 2015

(30) Foreign Application Priority Data
May 28, 2014 (DE) .................. 10 2014 007 903

(51) Int. Cl.
*H01L 21/683* (2006.01)
*H02N 13/00* (2006.01)
*H01L 21/687* (2006.01)

(52) U.S. Cl.
CPC .......... *H02N 13/00* (2013.01); *H01L 21/6833* (2013.01); *H01L 21/6875* (2013.01); *Y10T 29/49886* (2015.01)

(58) Field of Classification Search
CPC .............................. H01L 21/6831; H02N 3/00
USPC ....................................................... 361/234
See application file for complete search history.

(56) References Cited

U.S. PATENT DOCUMENTS

| | | |
|---|---|---|
| 4,502,094 A | 2/1985 | Lewin et al. |
| 5,535,090 A | 7/1996 | Sherman |
| 5,825,607 A * | 10/1998 | Burkhart ............. H01L 21/6831 361/234 |
| 5,841,624 A * | 11/1998 | Xu ....................... H01L 21/6831 279/128 |
| 5,903,428 A * | 5/1999 | Grimard ............. H01L 21/6833 279/128 |

(Continued)

FOREIGN PATENT DOCUMENTS

| | | |
|---|---|---|
| EP | 1521120 A2 | 4/2005 |
| EP | 2793083 A1 | 10/2014 |

(Continued)

OTHER PUBLICATIONS

English abstract for JP 2007027494 A (2007).

*Primary Examiner* — Scott Bauer
(74) *Attorney, Agent, or Firm* — Caesar Rivise, PC

(57) ABSTRACT

Holding apparatus (100) for electrostatically holding component (1), (e.g., a silicon wafer), includes base body (10) composed of first and second plates (11A,12), the first plate being arranged on upper side (10A) of base body (10) and second plate (12) carrying first plate (11A), and second plate (12) being an electrically insulating material, a plurality of projecting, upper burls (13A) arranged on upper side (10A) and forming a support surface for component (1), and first electrode device (20A) having first electrodes (21A) arranged on upper side (10A) for receiving a clamping voltage, wherein first plate (11A) is produced from electrically conductive, Si-based ceramic and carries upper plate insulating layer (14A) which covers upper side (10A), having upper burls (13A), and the first electrodes (21A) include electrode layers arranged on upper burls (13A) and each carry upper electrode insulating layer (15A). A method for producing the holding apparatus is also described.

11 Claims, 1 Drawing Sheet

(56) References Cited

U.S. PATENT DOCUMENTS

| | | | |
|---|---|---|---|
| 8,358,493 B2 * | 1/2013 | Kugimoto | H01L 21/6831 252/520.5 |
| 8,476,167 B2 | 7/2013 | Van Mierlo et al. | |
| 8,902,562 B2 | 12/2014 | Helmus et al. | |
| 2005/0181617 A1 | 8/2005 | Bosch | |
| 2006/0016554 A1 | 1/2006 | Ahn | |
| 2009/0308538 A1 | 12/2009 | Yonekura et al. | |
| 2009/0310274 A1 | 12/2009 | Koyama et al. | |
| 2010/0039747 A1 | 2/2010 | Sansoni et al. | |
| 2010/0206454 A1 | 8/2010 | Maeda et al. | |
| 2012/0299253 A1 | 11/2012 | Kosakai et al. | |
| 2013/0033690 A1 | 2/2013 | Helmus et al. | |
| 2013/0148253 A1 | 6/2013 | Komatsu et al. | |
| 2013/0308116 A1 | 11/2013 | Helmus et al. | |
| 2014/0008880 A1 | 1/2014 | Miura et al. | |
| 2014/0042716 A1 | 2/2014 | Miura et al. | |
| 2014/0376148 A1 | 12/2014 | Sasaki et al. | |

FOREIGN PATENT DOCUMENTS

| | | |
|---|---|---|
| JP | 2007027494 A | 2/2007 |
| WO | 2013118781 A1 | 8/2013 |
| WO | 2013160026 A2 | 10/2013 |

\* cited by examiner

CLAMP WITH BURLS-ELECTRODE

BACKGROUND OF THE INVENTION

The invention relates to a holding apparatus adapted for electrostatically holding a component, in particular a silicon wafer. The invention relates also to a method for producing the holding apparatus. Applications of the invention are in the provision of devices or tools for holding components by means of electrostatic forces, in particular for holding semiconductor components, for example silicon wafers.

Holding apparatuses for holding components electrostatically, which are also referred to as electrostatic holding apparatuses, electrostatic clamping apparatuses, electrostatic clamps, ESCs or electrostatic chucks, are known in general. An important application of electrostatic holding apparatuses is in holding silicon wafers in lithographic semiconductor processing, for example in chip production, in which the particular advantages of electrostatic holding, such as the ease of switching of electrostatic holding or clamping forces, a high positioning accuracy and the reliable fixing of silicon wafers, are exploited.

Typically, an electrostatic holding apparatus has a structure having a plurality of plate-type or layer-type elements that perform differing functions (see e.g. U.S. Pat. No. 4,502,094 or U.S. Pat. No. 8,476,167). At least one plate-type element is equipped with an electrode device with which the electrostatic holding forces are generated. According to U.S. Pat. No. 8,476,167, the electrode device comprises a plurality of electrodes which are embedded between the plate-type elements. Furthermore, an electrostatic holding apparatus typically has at least on its upper side a plurality of projecting upper burls which form a support surface for the silicon wafer.

A conventional electrostatic holding apparatus having embedded electrodes, for example according to U.S. Pat. No. 8,476,167, has the following disadvantages. Because the electrostatic holding force depends on the distance between the silicon wafer and the electrodes, burls having as small a height as possible (e.g. <10 µm) are used to generate a high holding force. However, this leads to an increase in the sensitivity to unwanted particles, which may not find sufficient space between the burls and can impair the planarity of the silicon wafer support. Alternatively, the holding force can be increased by increasing the electrode voltage, but this is associated with risks relating to electrical breakdowns or other faults. Furthermore, because the electrodes are arranged in the spaces between the burls, the silicon wafer that is held can be deformed to an undesirably high degree between the bearing contact points. There can be further disadvantages in relation to the thermal and mechanical coupling of the silicon wafer that is held. For example, the silicon wafer can tend to slip sideways along the extent of the support surface despite a high holding force.

The mentioned disadvantages occur not only in the case of electrostatic holding apparatuses for silicon wafers, but also in the case of holding apparatuses having embedded electrodes for other components, such as, for example, for glass plates having a transparent electrode (ITO), which form AMLCD substrates.

OBJECTS OF THE INVENTION

The objective of the invention is to provide an improved electrostatic holding apparatus which avoids disadvantages of conventional techniques. The holding apparatus is to permit in particular a reduction of the clamping voltage without impairment of the electrostatic holding forces, a reduced sensitivity to unwanted particles, less deformation of the component that is held, improved mechanical coupling of the component and/or improved thermal coupling of the component.

A further objective of the invention is to provide an improved method for producing the electrostatic holding apparatus which avoids disadvantages of conventional techniques and is distinguished in particular by a simplified procedure.

These objectives are achieved, respectively, by a holding apparatus and by a method having the features of the invention.

DESCRIPTION OF THE INVENTION

According to a first general aspect of the invention there is provided a holding apparatus for electrostatically holding a component, in particular a silicon wafer, which comprises a base body composed of a first plate and a second plate, the first plate being arranged on an upper side of the base body and the second plate carrying the first plate, and the second plate being made of an electrically insulating material. On the first plate there are provided upper burls which project from the upper side of the base body and the upper end faces of which span a support surface for the component. The holding apparatus further comprises a first electrode device having a plurality of first electrodes which are arranged on the upper side of the base body for receiving a clamping voltage. According to the invention, the first plate is made of an electrically conductive, Si-based ceramic and provided with an upper plate insulating layer which covers the upper side of the base body, including the upper burls. The first electrodes further comprise electrode layers which are arranged on the upper burls, in particular on the end faces thereof, and each carry an upper electrode insulating layer.

According to the invention, the distance of the electrodes from the component to be held is advantageously minimized, as a result of which the height of the burls can be increased in comparison with conventional techniques without the holding force being impaired. At the same time, the thermal coupling with the component to be held is improved by the use of the upper plate of the base body, which comprises Si-based ceramic, and the relatively thin electrode insulating layer on the electrodes. The mentioned features, in combination, allow the component to be held with high thermal and mechanical stability and planarity. A further advantage of the invention is the possibility of reducing the time for producing the holding apparatus, because the holding apparatus can be made of a relatively smaller number of parts.

According to a second general aspect of the invention, the holding apparatus according to the above first general aspect of the invention is produced by prefabricating the first plate having the upper burls and the second plate, depositing the upper plate insulating layer on the first plate, depositing the first electrodes and the upper electrode insulating layers on the upper burls of the first plate, and joining the first plate to the second plate.

According to a preferred embodiment of the invention, the holding apparatus is configured for electrostatic fixing to a carrier platform. For this purpose, the holding apparatus has a third plate which is arranged on the second plate on an underside of the base body opposite the first plate and is likewise made of an electrically conductive, Si-based ceramic. The third plate is preferably made of the same ceramic as the first plate. Furthermore, there are provided on the third plate a plurality of projecting, lower burls which project from the underside of the base body and whose lower end faces span a support surface (carrier surface) for the holding apparatus on the carrier platform. A second electrode device having a plurality of second electrodes is arranged on the underside of the base body, the second electrodes comprising electrode layers which are arranged on the lower burls, in particular on the end faces thereof, are electrically insulated from the underside of the base body and the lower burls by a lower plate insulating layer, and each carry a lower electrode insulating layer. For the production of the holding apparatus according to the embodiment having the third plate, the third plate having the lower burls is likewise prefabricated, provided with the lower plate insulating layer, the second electrodes and the lower electrode insulating layers and joined to the second plate.

Preferably, the first and/or second electrodes are arranged only on the upper and/or lower burls, in particular on the flattened end faces thereof, while spaces between the upper and/or lower burls are free of electrodes for receiving the clamping voltage. Advantageously, deformation of the component to be held between the burls is thereby ruled out.

Advantageously, there are various possibilities for configuring the upper and/or lower burls in dependence on the requirements of a specific application. According to a first, particularly preferred variant, the upper and/or lower burls have a surface roughness Ra>200 nm, in particular Ra>250 nm. The inventor has found that the unintentional sideways displacement of components along the extent of the support surface is caused by low roughness of the burls provided in conventional techniques (Ra<40 nm). By contrast, the risk of lateral displacement is reduced by the roughness provided according to the invention. The roughness is produced, for example, by etching the burls and remains effective even after deposition of the electrode insulating layer, the electrodes and the anti-wear layer optionally provided on the free surface of the burls.

According to a further variant, the upper and/or lower burls are connected electrically conductively to the first and/or third plate. Advantageously, the thermal coupling of the component to be held is thereby improved. Particularly preferably, the upper and/or lower burls are made of the same electrically conductive, Si-based ceramic as the first and/or third plate. For example, the upper and/or lower burls can be integrally connected to the first and/or third plate. The burls can be produced by structuring of the associated plate, for example by means of etching, so that the production of the holding apparatus is simplified further.

According to further preferred embodiments of the invention, the upper and/or lower burls are equipped with upper and/or lower anti-wear layers. The anti-wear layers are in each case correspondingly arranged on the upper and/or lower electrode insulating layers. Advantageously, the anti-wear layers, which are preferably made of silicon nitride or electrically insulating, amorphous carbon, offer mechanical protection for the electrode insulating layers and the electrodes and lengthen the service life of the holding apparatus.

For contacting of the electrodes, the first and/or second electrode devices preferably have first and/or second conductor strips which are correspondingly arranged on the upper side and/or the underside of the base body, in particular on the associated plate insulating layer. The conductor strips are configured to connect the first and/or second electrodes to a voltage source for generating an electrostatic clamping voltage.

The electrostatic clamping voltage is generated between the electrodes and the component to be held, wherein the component is connected to a separate voltage connection or, when the burls additionally carry a layer of an electrically conductive material connected with ground potential, is connected with ground potential by being placed on the burls. Advantageously, it is therefore sufficient for each electrode to be equipped with precisely one conductor strip.

Advantageously, there are various possibilities for connecting the electrodes to the voltage source via the conductor strips. For example, all the electrodes can be connected in parallel. This variant of the invention offers the advantage that the arrangement of the conductor strips is simplified. Alternatively, at least one of the electrodes can be connected to the voltage source via a conductor strip which is electrically separate from the other conductor strips and is configured to apply a specific clamping voltage to the associated electrode. Advantageously, this allows the clamping voltage to be varied along the surface of the holding apparatus, for example in order to compensate for local variations in the electrostatic holding force. For example, each of the electrodes can be connected to the voltage source via an associated conductor strip, which is separate from all the other conductor strips, and receive a specific clamping voltage. Alternatively, electrodes can be equipped in groups with electrically connected conductor strips, so that the electrodes of one group of electrodes can receive a common specific clamping voltage. This advantageously allows the electrostatic holding force to be optimized along the surface of the holding apparatus, and the planarity of the component that is being held, for example at the outer edge of the holding apparatus, can be improved. Furthermore, applying specific clamping voltages to individual or groups of electrodes allows the clamping operation to be controlled purposively, for example in the case of removal of a held component.

According to further variants of the invention, the first and/or the third plate can have at least one electrical contact region for connection with ground potential. The contact region allows the plates to be connected directly with ground potential, so that the robustness of the holding apparatus is improved further.

Preferably, the first plate consists of the electrically conductive, Si-based ceramic, i.e. the first plate is made of a ceramic that includes Si. SiC-including ceramics, such as, for example, SiSiC or SSiC ceramic, have been found to be particularly advantageous. The second plate preferably consists of an electrically insulating solid, particularly preferably of $Si_3N_4$ or SiC ceramic or of borosilicate glass (e.g. glass having the product name Borofloat 33). The first and/or second electrodes are preferably made of Al, TiN or WC.

BRIEF DESCRIPTION OF THE DRAWINGS

Further details and advantages of the invention will be described in the following with reference to the accompanying drawings, in which.

Features of preferred embodiments of the electrostatic holding apparatus according to the invention and of the method for the production thereof are described in the following with reference, by way of example, to features of an electrostatic holding apparatus for silicon wafers. It is emphasized that the implementation of the invention is not limited to holding apparatuses for silicon wafers. Rather, other applications of the holding apparatus are also conceivable, such as, for example, for holding glass plates having transparent electrodes for the production of screens, in which cases the form of the upper and/or lower support or carrier surfaces of the first and/or third plates, their structuring, the materials and the dimensions are matched to the specific requirements. Furthermore, it is emphasized that the implementation of the invention is not limited to the variants, shown by way of example, of the holding apparatus having a first, second and third plate, each of which is produced in one piece. Alternatively, at least one of the plates can be produced in multilayer form from a plurality of partial plates. Finally, the figures do not show illustrations of holding apparatuses that are to scale, but illustrate in particular the provision of electrodes on the upper and lower burls.

The structure of the base body of the holding apparatus can be chosen as is known per se from conventional holding apparatuses. Further details of the specific form of the holding apparatus, for example as a monopolar or bipolar holding apparatus, the arrangement of the burls and electrodes, for example in a so-called Manhattan pattern, the temperature adjustment and the application of voltages in order to generate the electrostatic holding forces will not be described, in so far as they are known from conventional holding apparatuses.

Figure 1:
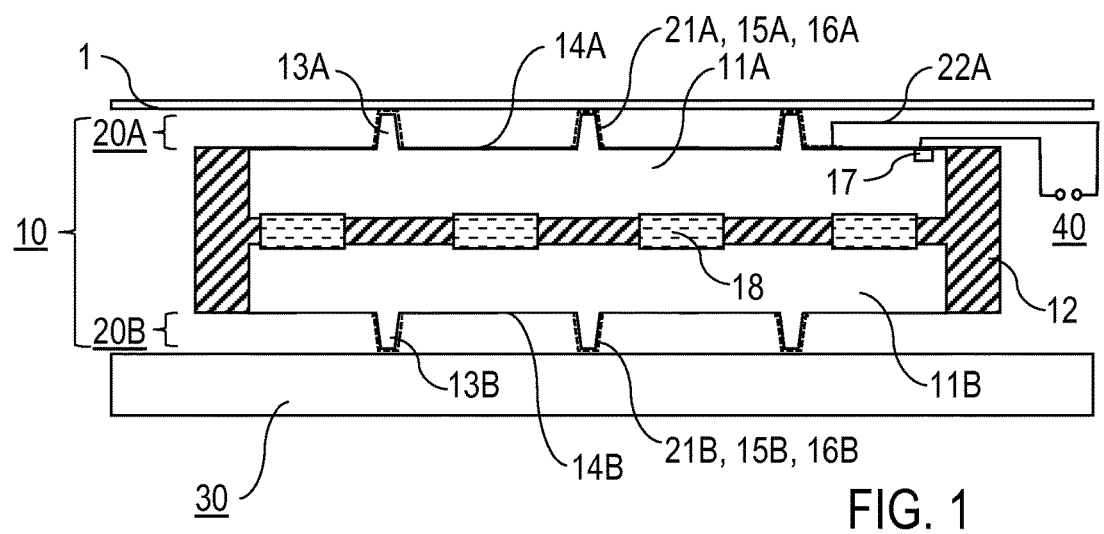
FIG. 1: is a schematic sectional view of a first embodiment of the electrostatic holding apparatus according to the invention.

FIG. 1 shows a schematic sectional view of a first embodiment of the electrostatic holding apparatus 100 according to the invention when used in semiconductor processing. The holding apparatus 100 comprises a base body 10 having a stack structure, comprising a first plate 11A, a second plate 12 and a third plate 11B. The first and third plates 11A, 11B are made of SiSiC, for example. For a monopolar holding apparatus, the first and third plates 11A, 11B have, for example, a circular shape with a diameter of 30 cm and in each case a thickness of 5 mm. Alternatively, larger dimensions can be provided, for example for holding glass plates having a transparent electrode a diameter of up to 2 m.

The second plate 12 is made of $Si_3N_4$, for example. The first and third plates 11A, 11B are connected to the second plate 12 on both sides. The second plate 12 has on its upper side and underside recesses into which the first and third plates 11A, 11B are set. The recesses on both sides of the second plate 12 have the advantage that all the outside faces of the holding apparatus 100 are electrically insulated. Furthermore, the surroundings are shielded from electrostatic effects in the lateral direction by the edges of the second plate 12.

The first and third plates 11A, 11B have projecting upper or lower burls 13A, 13B, respectively, which span a support surface for a component 1, for example a silicon wafer, or a carrier surface for positioning of the holding apparatus 100 on a carrier platform 30. The burls 13A, 13B have, for example, the form of cuboids, cylinders, pyramids, cones, truncated pyramids and/or truncated cones, preferably with a height in the range of from 5 µm to 25 µm, a diameter of from 20 µm to 100 µm and a mutual distance of 1 mm.

On the surfaces of the first and third plates 11A, 11B there are arranged upper and lower plate insulating layers 14A, 14B, respectively, which cover the upper side and underside of the base body 10 in an electrically insulating manner. The plate insulating layers 14A, 14B are made of, for example, silicon nitride and/or silicon oxide with a thickness of 2 µm. Each of the upper burls 13A further carries a layer sequence of an upper plate insulating layer 14A, a first electrode 21A, an upper electrode insulating layer 15A and an upper anti-wear layer 16A, which are illustrated in detail in FIG. 2.

Figure 2:
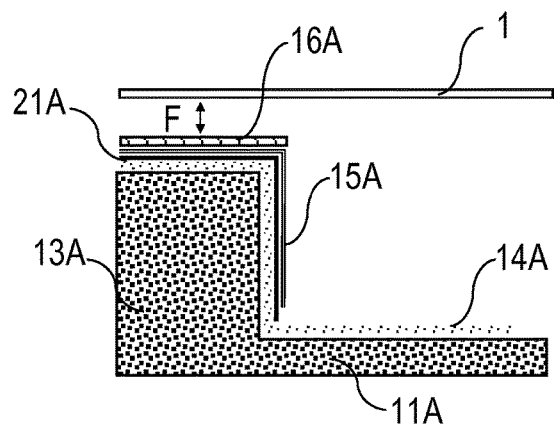
FIG. 2: is a schematic illustration of an upper, projecting burl having an electrode.

Each of the lower burls 13B correspondingly carries a layer sequence of a lower plate insulating layer 14B, a second electrode 21B, a lower electrode insulating layer 15B and a lower anti-wear layer 16B, which are arranged on the underside of the base body 10 as illustrated in FIG. 2 with reference to the upper side.

The first and third plates 11A, 11B are electrically conductive. For connection with ground potential, the first and third plates 11A, 11B are each equipped with a contact region. By way of example, the contact region 17 is shown on the first plate 11A, which contact region is configured for electrical connection to a ground contact of a voltage source 40. The contact regions (e.g. 17) each comprise, for example, a blind bore in the first or third plate 11A, 11B, which blind bore has a diameter of 0.5 mm, for example, and is designed as a fit. A metal sleeve, for example of gold, which receives a line for connection to the voltage source (e.g. 40) is fitted into the bore.

Temperature adjustment medium lines 18 which are coupled with a temperature adjustment device (not shown) are set into the second plate 12. By means of the temperature adjustment device, a temperature adjustment medium circuit is formed, by means of which the temperature of the holding apparatus 100 can be adjusted.

FIG. 2 illustrates, in an enlarged sectional view, a portion of the first plate 11A with the upper burl 13A. The plate insulating layer 14A is arranged on the surface of the first plate 11A. The layer-type electrode is arranged restricted to the surface of the upper burl 13A. The electrode 21A can, as shown, cover the entire burl 13A or only the upper end face thereof, and it is produced, for example, by deposition of a TiN layer with a thickness of 50 nm. The advantage of TiN is the good passivation for protection of the underlying insulating layer. The electrode 21A is connected to a voltage source 40 via a separate conductor strip 22A (see FIG. 1), which runs on the surface of the plate insulating layer 14A. On the electrode 21A there are arranged the upper electrode insulating layer 15A, for example of aluminum nitride and/or silicon nitride, and the upper anti-wear layer 16A, for example of amorphous carbon (DLN or DLC, diamond-like nanocomposite/carbon), with thicknesses of up to 1 µm.

The structure according to FIG. 2 enables the electrostatic holding force F to act at the end faces of the projecting burls 13A (see double arrow), while no electrostatic holding force is formed between the burls 13A. The holding force F can correspond to a clamping pressure of 1 bar at a clamping voltage of 400 V, for example.

The holding apparatus 100 is produced by first prefabricating the plates 11A, 12 and 11B individually. The plate insulating layers, the electrodes and the electrode insulating layers are deposited on the surfaces of the first and third plates 11A, 11B, for example by means of vapor deposition or sputtering. The first plate 11A and the third plate 11B are subsequently each connected to the second plate 12 by high-temperature soldering. The electrical and hydraulic connections are then coupled with the contact regions 17 or the temperature adjustment medium lines 18.

The features of the invention disclosed in the preceding description, the drawings and the claims can be of significance, both singly or in combination, for the implementation of the invention in its various embodiments.

What is claimed is:
1. A holding apparatus configured to electrostatically hold a component, comprising:
 a base body which comprises a first plate and a second plate, the first plate being arranged on an upper side of the base body and the second plate carrying the first plate, and the second plate comprising an electrically insulating material, a plurality of projecting, upper burls which are arranged on the upper side of the base body and form a support surface for the component, and a first electrode device having a plurality of first electrodes which are arranged on the upper side of the base body for receiving a clamping voltage, wherein the first plate comprises an electrically conductive, Si-based ceramic and carries an upper plate insulating layer which covers the upper side of the base body having the upper burls, and the first electrodes comprise electrode layers which are arranged on the upper burls and each carry an upper electrode insulating layer.

2. The holding apparatus according to claim 1, which further comprises a third plate which is arranged on an underside of the base body, carries the second plate and comprises an electrically conductive, Si-based ceramic, a plurality of projecting, lower burls which are arranged on the underside of the base body and form a carrier surface for the holding apparatus on a carrier platform, a second electrode device having a plurality of second electrodes which are arranged on the underside of the base body for receiving a clamping voltage, wherein the second plate carries a lower plate insulating layer which covers the underside of the base body having the lower burls, and the second electrodes comprise electrode layers which are arranged on the lower burls and each carry a lower electrode insulating layer.

3. The holding apparatus according to claim 1, wherein at least one of the first and second electrodes are limited to the upper and lower burls, respectively, and spaces between at least one of the upper and lower burls are free of electrodes for receiving the clamping voltage.

4. The holding apparatus according to claim 1, having at least one of the features:

at least one of the upper and lower burls have a surface roughness Ra>200 nm, at least one of the upper and lower burls are connected electrically conductively to the first or second plates, at least one of the upper and lower burls comprise the electrically conductive, Si-based ceramic, and at least one of the upper and lower burls are integrally connected to the first or second plates.

5. The holding apparatus according to claim 1, wherein at least one of the upper and a lower electrode insulating layers carry at least one of an upper and a lower anti-wear layer on the upper or lower burls.

6. The holding apparatus according to claim 5, wherein at least one of the upper and lower anti-wear layer comprises silicon carbide or electrically insulating, amorphous carbon.

7. The holding apparatus according to claim 1, wherein at least one of the first and second electrode devices comprises at least one of first and second conductor strips, respectively, which are arranged for connecting at least one of the first and second electrodes to a voltage source.

8. The holding apparatus according to claim 7, wherein at least one of the first and second conductor strips and the voltage source are so configured that at least one of the first and second electrodes can selectively receive a specific clamping voltage.

9. The holding apparatus according to claim 1, wherein at least one of the first and third plates has at least one electrical contact region for connection with ground potential.

10. The holding apparatus according to claim 1, having at least one of the features at least one of the first and third plates comprises SiSiC or SSiC ceramic, the second plate comprises $Si_3N_4$, SiC ceramic or borosilicate glass, and at least one of the first and second electrodes comprise Al, TiN or WC.

11. A method for producing a holding apparatus according to claim 1, comprising the steps prefabricating the first and second plates, depositing the upper plate insulating layer on the first plate, depositing the first electrodes and the upper electrode insulating layers on the upper burls, and joining the first plate to the second plate.

\* \* \* \* \*